(12) United States Patent
Takaoka et al.

(10) Patent No.: US 7,259,372 B2
(45) Date of Patent: Aug. 21, 2007

(54) PROCESSING METHOD USING PROBE OF SCANNING PROBE MICROSCOPE

(75) Inventors: Osamu Takaoka, Chiba (JP); Masatoshi Yasutake, Chiba (JP); Shigeru Wakiyama, Chiba (JP); Naoya Watanabe, Chiba (JP)

(73) Assignee: SII NanoTechnology Inc. (JP)

( * ) Notice: Subject to any disclaimer, the term of this patent is extended or adjusted under 35 U.S.C. 154(b) by 0 days.

(21) Appl. No.: 11/135,076

(22) Filed: May 23, 2005

(65) Prior Publication Data
US 2005/0263700 A1    Dec. 1, 2005

(30) Foreign Application Priority Data
May 25, 2004    (JP) .............................. 2004-154059

(51) Int. Cl.
*G01N 23/00*    (2006.01)

(52) U.S. Cl. ...................... 250/309; 250/306; 310/316; 310/317; 204/192.32

(58) Field of Classification Search ..................... None
See application file for complete search history.

(56) References Cited

U.S. PATENT DOCUMENTS 5,557,156 A * 9/1996 Elings .................... 310/316.01
6,953,519 B2 * 10/2005 Shirakawabe et al. . 204/192.32
2005/0193576 A1 * 9/2005 Hollman et al. .............. 33/286

* cited by examiner

*Primary Examiner*—Jack I. Berman
*Assistant Examiner*—Zia R. Hashmi
(74) *Attorney, Agent, or Firm*—Adams & Wilks

(57) ABSTRACT

A processing method uses a probe of a scanning probe microscope. A fine marker is formed in a processing material by thrusting the probe, which is made of a material harder than the processing material, into a portion of the processing material disposed in the vicinity of an area of the processing material to be processed by the probe during a processing operation. A position of the fine marker on the processing material is detected during the processing operation. A drift amount of the area of the processing material is calculated in accordance with the detected position of the fine marker. A position of the area of the processing material is corrected in accordance with the calculated drift amount.

14 Claims, 2 Drawing Sheets

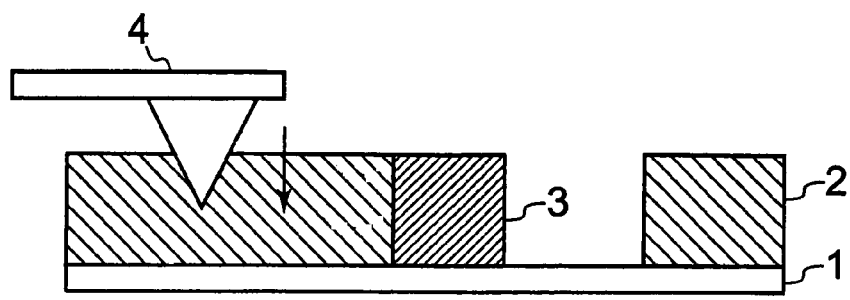
FIG. 1A
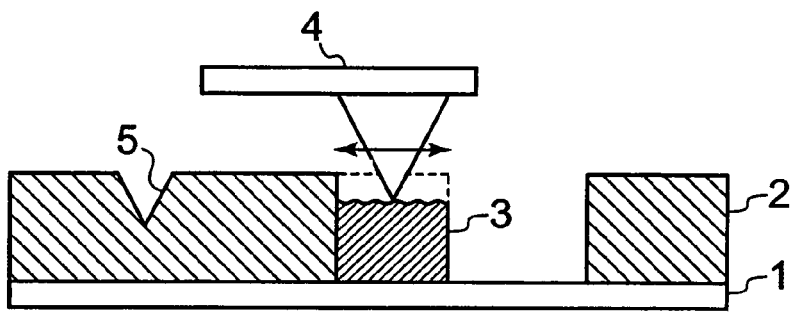
FIG. 1B
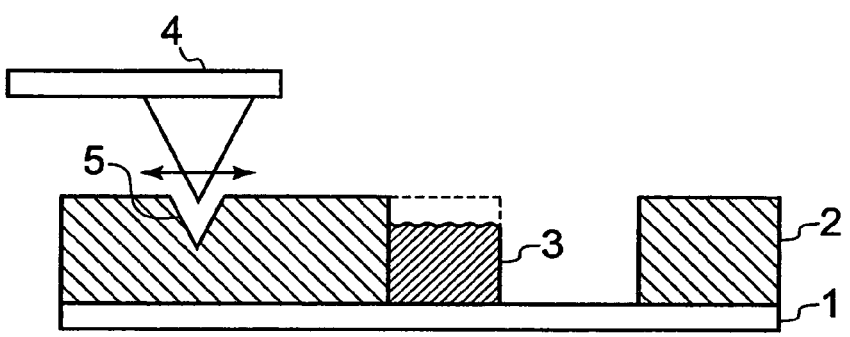
FIG. 1C
FIG. 2
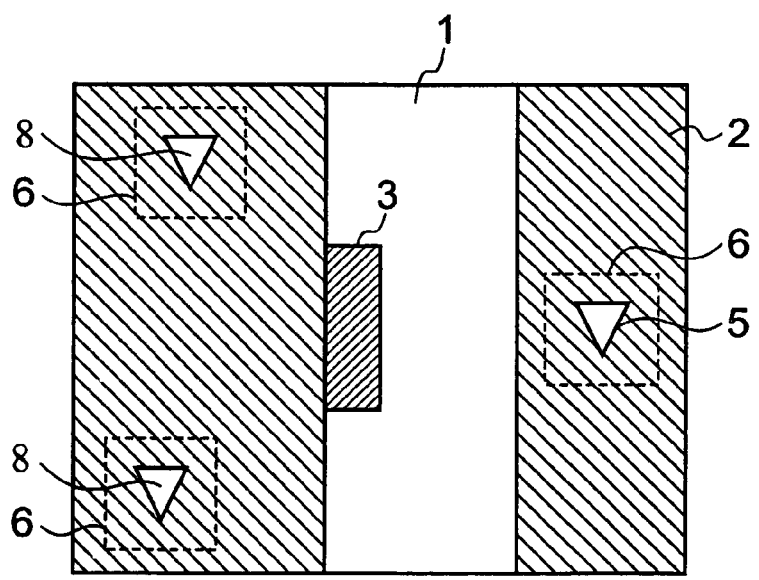

PROCESSING METHOD USING PROBE OF SCANNING PROBE MICROSCOPE

BACKGROUND OF THE INVENTION

The present invention relates to a processing method using a probe of a scanning probe microscope and, more specifically, to a method of correcting drift of a processing position.

A microprocessing technology on the order of nanometer is required for improvement of level and degree of integration of functions, and research and development regarding processing technologies, such as local anodic oxidation or fine scratch processing using a scanning probe microscope (SPM), has been extensively carried out. Not only has microprocessing become important, but also processing with high degree of accuracy is now increasingly required.

In order to improve the accuracy of microprocessing, not only is the microprocessing capability or a highly accurate positioning technology important, but also reduction or correction of drift, such as thermal drift unavoidably generated during processing, have to be performed since processing using the SPM takes time. As a method of correcting drift on the order of 1 nm, a method of correcting a processing range in real time using a laser interferometer has been employed. The method using the laser interferometer has an advantage of real time, but since the amount of displacement of a mirror mounted to a stage is observed instead of the position near the processing point, there may be the case in which the amount of drift correction is different from that actually required. In particular, when the sample is a large sample such as a photomask or a wafer, the distance from the mirror and the actual processing point increases, and hence the tendency of being different from the actually required amount of drift correction increases correspondingly. When the temperature between the sample and the mirror is different, the laser interferometer cannot measure the thermal drift of the sample accurately, and hence the processing is performed after having waited until the sample and the mirror are thermally balanced.

In the processing using the SPM, the influence of the drift is reduced by performing the drift correction with the measured value of the laser interferometer or by repeating the process of observing the area including the processing point in an observation mode in the course of processing and then redefining the processing area before restarting the processing. In the method of observing in the observation mode and redefining the processing area before restarting the processing, if the processing area is large and observation is performed to an extent sufficient for the drift correction, it takes long time for observation, and hence there may arise a difference between the result of observation and the actually required amount of the drift correction, and in addition, the throughput is deteriorated. When the observation is made roughly, it does not take long time, but the accuracy of drift correction is disadvantageously deteriorated. Although a method of observing a characteristic pattern at the portion near the processing point in the course of processing and then performing the drift correction by pattern matching is also conceivable, there is a problem that there is no guarantee that a pattern which can be used for pattern matching both in X-direction and Y-direction always exists at the portion near the processing point.

In the case of defect correction of a photomask or manufacturing a sample for a transmission electron microscope using a focused ion beam, a method of processing including steps of opening small holes with a concentrated ion beam at positions near the processing point as drift markers, selectively scanning the area of several micrometers including small holes which are formed regularly by interrupting the processing in the course of the processing, obtaining the drift amount from displacement of the center of gravity of the small holes, and correcting the range of processing is employed, whereby the processing with high degree of accuracy of 20 nm or below is realized (for example, JP-B-5-4660 (P. 2, FIG. 11)). However, in the processing using the SPM, such a method has not been employed.

An atom-tracking method is developed as a method of tracking a substance of an atomic level size on the surface with atomic level accuracy. The atom-tracking method is a method developed for the scanning tunneling microscope (STM) which enables tracking of surface diffusion of an atomic size atom, in which a probe is rotated at a high speed substantially in radius of an atom in a horizontal plane, detecting a varied signal which depends on the position of a tunneling current by a lock-in amplifier, and giving feedback to X-Y scanning (for example, B. S. Swartzentruber. Phys. Rev. Lett. 76 459-462(1996)), and has a potential for correcting the drift of 1 nm level in real time. However, it has not been used for the aforementioned drift correction.

The present invention is intended to enable processing with high degree of accuracy in a processing machine in which a scanning probe microscope is applied.

SUMMARY OF THE INVENTION

In a processing method using a probe of a scanning probe microscope, fine markers are formed by thrusting a probe, which is harder than material to be processed, into a portion near the area to be processed by the probe, the positions of the fine markers are detected in the course of the processing using the probe, the drift amount is calculated, the position of the area to be processed is corrected by an amount corresponding to the drift amount, and the processing is restarted. Detection of the positions of the fine markers is performed based on the position of the center of gravity or the deepermost portion.

The steps of detecting the fine markers, calculating the drift amount, and processing in the area corrected by the drift amount are repeated for achieving the processing with a high degree of accuracy.

When the magnification or rotation is different for each time of image observation, the fine markers are formed at three or more positions by thrusting the probe, which is harder than the material to be processed, into positions which surround the processing area, and the positional relation between the fine markers and the processing area is obtained. Then, steps of obtaining the position of the processing area with respect to the respective fine markers by affine transformation in the course of processing, calculating the drift amount of the processing area, and restarting the processing in the processing area where the drift amount is corrected are performed. The process of detecting the 3 or more fine markers, calculating the drift amount, and processing in the area where the calculated drift amount is corrected are repeated to achieve the processing with high degree of accuracy. The affine transformation itself is a method which is generally used in the fields of mathematics and image processing.

The atom-tracking method developed for tracking the surface diffusion of the atom is used for tracking the change of the position of the markers formed for drift correction due to drift. The multi probe SPM processing machine performs processing while tracking the markers using one of the probes via the atom tracking method, feeding back the result of tracking in real time to the scanning area (processing area) for other probe for processing, and correcting the drift. In other words, it searches for the deepermost portion of the fine markers by rotating the probe substantially in radius of atom at high speed in a horizontal plane and obtaining the point where the largest tunneling current is detected while flowing the tunneling current between the probe and the sample, and determines this point as a maker position. Consequently, the deepermost portion at the marker positions is accurately obtained, whereby more accurate processing is enabled.

Not only the pattern formed simply by thrusting the probe, but a pattern which can indicate displacement in the X-direction and Y-direction by thrusting the probe is formed, then the pattern position and the pattern form are stored in advance. Then, matching with the stored pattern is performed by observing the area including the formed pattern in the course of processing, the drift amount is calculated in the X and Y directions, and the result is fed back to the scanning area (processing area) of the probe for processing.

By using the probe formed of hard material such as diamond, the fine markers can be formed on most materials by thrusting the probe. By using the probe having a pointed end, the fine markers can be formed and hence the drift correction with high degree of accuracy is achieved.

Even when the magnification or the rotation is different for each time of image observation, further accurate drift correction can be achieved by the drift estimation in the processing area by the affine transformation of the markers at three or more positions.

Since the drift at the portion near the processing point can be detected with high degree of accuracy by applying the atom-tracking method to the fine hole markers provided on the conductive portion near the processing point, the drift correction with high degree of accuracy is enabled. Also, due to the high-speed trackability of the atom-tracking method, the real time correction is enabled.

By forming the pattern which can indicate displacement in the X direction and the Y direction like a cross-shape or L-shape, the drift amount can be calculated with high degree of accuracy by pattern matching, thereby achieving the accurate drift correction.

BRIEF DESCRIPTION OF THE DRAWINGS

FIGS. 1A-1C are schematic cross-sectional views showing a characteristic of the present invention in the most understandable manner.

FIG. 2 is an explanatory plan view showing a case in which a drift is corrected by three or more drift markers.

DETAILED DESCRIPTION OF THE INVENTION

Figure 3:
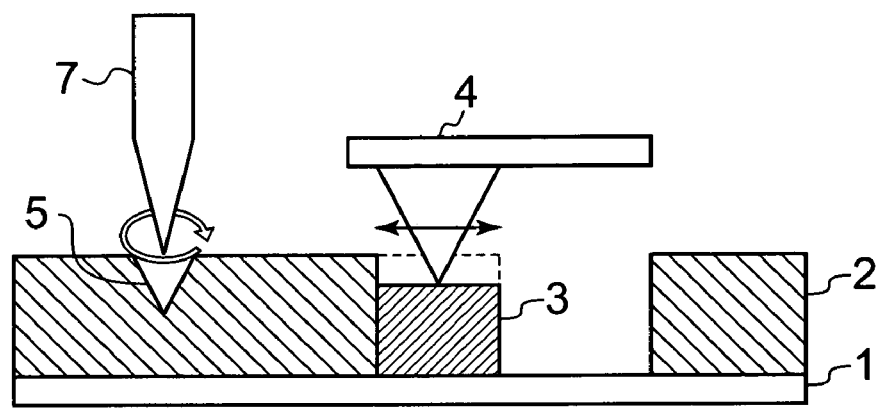
FIG. 3 is an explanatory schematic cross-sectional view showing a case of correcting a drift by an atom-tracking method using one scanning tunneling microscope probe of a multi-probe scanning probe microscope in real time and fabricating with another probe.

A case in which the invention is applied to removal of defect of excessive pattern of the photomask will be described as an example of the present invention below.

As shown in FIGS. 1A-1C, a drift is corrected by forming fine markers 5 by thrusting a probe 4 into shield film 2 on glass substrate 1, which is harder than material to be processed, at the portion near a black defect 3, which is a processing area as shown FIG. 1A, detecting the position of the markers 5 in the course of processing, calculating the drift amount as shown in FIGS. 1B and 1C, and feeding back the calculated drift amount to the processing area.

When the magnification or the rotation is different for each time of image observation, the fine markers 5 are formed at three or more positions by thrusting the probe 4, which is harder than the material to be processed, at the portion near the processing area as shown in FIG. 2, and the positional relation between the fine markers 5 and the processing area is obtained in advance. Then, the positions of the fine markers are detected in the course of processing with probe 4 scanning scanning area 6, and the position of the processing area in the aforementioned positional relation is obtained by the affine transformation. Processing is performed by correcting the position of the processing area drifted as described above. The drift correction of the fine markers can be performed more accurately by arranging the fine markers so that the processing area 3 is surrounded by lines connecting the fine markers.

An image including the area to be processed is obtained by an atomic force microscope or the like, and the processing area is determined from the obtained image. As shown in FIG. 3, the markers 5 on the order of several ten nanometers to be tracked by the atom tracking method are formed by thrusting the probe 4, which is harder than the material to be processed, into the conductive material near the processing area. Then, processing with high degree of accuracy such as anodic oxidation or scratch is performed by tracking deepermost portions of the markers 5 by one of the STM probes 7 of the SPM processing machine having a number of probes by the atom-tracking method, feeding back the amount of movement to the scanning range (processing area) of the probe for processing in real time, and correcting the drift.

Figure 4:
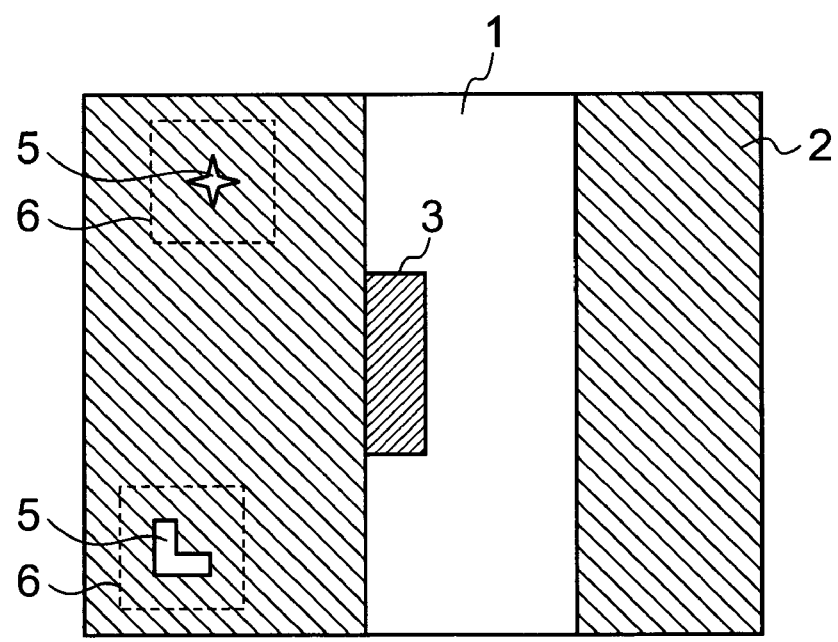
FIG. 4 is an explanatory plan view showing a case of correcting the drift by forming drift markers by scanning the probe in a state in which a probe, which is harder than material to be processed, is thrust, and performing the pattern matching therewith.

As a matter of course, drift correction with high degree of accuracy is also achieved not only by forming the markers 5 formed simply by thrusting the probe 4, but also by forming a fine cross-shaped or L-shaped pattern 8 by scanning the probe 4, which is harder than the material to be processed, in the X-direction and the Y-direction in a state of being thrust as shown in FIG. 4, and performing the pattern matching with these patterns as the drift markers to correct the drift in the X-direction and Y-direction.

What is claimed is:

1. A processing method using a probe of a scanning probe microscope, comprising the steps of:
   forming a fine marker in a material to be processed by thrusting a probe made of a material harder than the material to be processed into a portion of the material to be processed that is in the vicinity of an area of the material to be processed by the probe during a processing operation;
   detecting a position of the fine marker during a processing operation;

calculating a drift amount of the area of the material to be processed in accordance with the detected position of the fine marker; and correcting a position of the area of the material to be processed by an amount corresponding to the calculated drift amount.

2. A processing method using a probe of a scanning probe microscope according to claim 1; wherein the detecting step comprises the step of detecting the position of the fine marker in accordance with a center of gravity of the fine marker.

3. A processing method using a probe of a scanning probe microscope according to claim 1; wherein the probe comprises a probe of a scanning tunnel microscope; wherein the processing material comprises a conductive material; and wherein the calculating step comprises the step of calculating the drift amount by tracking a position of a deepermost portion of the fine marker with the probe using an atom-tracking method while applying a tunneling current between the fine marker and the probe.

4. A processing method using a probe of a scanning probe microscope according to claim 1; wherein the fine marker has a cross-shaped or L-shaped pattern; further comprising the steps of storing the pattern shapes of the fine marker in advance, observing the pattern of the fine marker during the processing operation, and matching the observed pattern of the fine marker with the stored pattern shapes; and wherein the calculating step comprises calculating the drift amount of the fine marker in the X direction and Y direction thereof, and the correcting step comprises correcting the position of the area to be processed by an amount corresponding to the calculated drift amount.

5. A processing method using a probe of a scanning probe microscope, comprising the steps of:

forming a plurality of fine markers in a material to be processed by thrusting a probe made of a material harder than the material to be processed into portions of the material to be processed disposed in the vicinity of an area of the material to be processed during a processing operation;

obtaining in advance a positional relation between positions of the fine markers and a position of the area of the material to be processed;

detecting the positions of the fine markers during a processing operation; and obtaining by affine transformation of the fine markers the position of the area of the material to be processed that has the same position relation with the detected positions of the fine markers as the position relation obtained in advance to thereby correct a drift of the position of the area of the material to be processed.

6. A processing method using a probe of a scanning probe microscope according to claim 5; wherein the forming step comprises the step of forming the plurality of fine markers in the material to be processed at positions surrounding the position of the area of the material to be processed.

7. A processing method using a probe of a scanning probe microscope according to claim 1; further comprising the step of storing in advance a preselected pattern shape of the fine marker, observing the pattern of the fine marker during the processing operation, and matching the observed pattern of the fine marker with the stored preselected pattern shape; and wherein the calculating step comprises calculating the drift amount of the fine marker in the X direction and Y direction thereof; and the correcting step comprises correcting the position of the area to be processed by an amount corresponding to the calculated drift amount.

8. A processing method using a probe of a scanning probe microscope according to claim 5; wherein the plurality of fine markers comprise three or more fine markers.

9. A processing method using a probe of a scanning probe microscope according to claim 6; wherein the plurality of fine markers comprise three or more fine markers.

10. A processing method comprising:

forming a fine marker in a processing material by thrusting a probe made of a material harder than the processing material into a portion of the processing material disposed in the vicinity of an area of the processing material to be processed by the probe during a processing operation;

detecting a position of the fine marker on the processing material during a processing operation;

calculating a drift amount of the area of the processing material in accordance with the detected position of the fine marker;

correcting a position of the area of the processing material in accordance with the calculated drift amount; and processing the area of the processing material at the corrected position thereof using the probe.

11. A processing method according to claim 10; further comprising the steps of repeating the detecting, calculating, correcting and processing steps a preselected number of times.

12. A processing method according to claim 10; wherein the detection step comprises the step of detecting the position of the fine marker in accordance a center of gravity of the fine marker.

13. A processing method according to claim 10; wherein the probe comprises a probe of a scanning tunnel microscope and the processing material comprises a conductive material.

14. A processing method according to claim 13; wherein the calculating step comprises the step of calculating the drift amount by tracking a position of a deepermost portion of the fine marker with the probe using an atom-tracking method while applying a tunneling current between the fine marker and the probe.

* * * * *